United States Patent [19]
Matsbara et al.

[11] Patent Number: 5,942,916
[45] Date of Patent: *Aug. 24, 1999

[54] LOGIC CIRCUIT

[75] Inventors: Gensoh Matsbara, Tokyo; Chikahiro Hori, Kanagawa, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/696,698

[22] Filed: Aug. 14, 1996

[30] Foreign Application Priority Data

Aug. 15, 1995 [JP] Japan ................. P07-208190

[51] Int. Cl.⁶ ............... H03K 19/096; H03K 19/017; H03K 3/286
[52] U.S. Cl. ................ 326/83; 326/17; 326/93; 326/98; 327/201; 327/222
[58] Field of Search .................. 326/17, 93, 95, 326/98, 83, 26–27; 327/202–203, 200–201, 218–219, 222, 225

[56] References Cited

U.S. PATENT DOCUMENTS

| | | |
|---|---|---|
| 3,786,282 | 1/1974 | Orndorff . |
| 4,766,334 | 8/1988 | Warner . |
| 5,140,179 | 8/1992 | Takano ............... 327/215 |
| 5,311,070 | 5/1994 | Dooley ............... 327/208 |
| 5,525,923 | 6/1996 | Bialas, Jr. et al. ........ 327/218 |
| 5,612,632 | 3/1997 | Mahant-Shetti et al. ...... 327/203 |

FOREIGN PATENT DOCUMENTS

| | | |
|---|---|---|
| 0 573 807 | 12/1993 | European Pat. Off. . |
| 0 611 053 | 8/1994 | European Pat. Off. . |
| 1-309510 | 12/1989 | Japan . |
| 3-57317 | 3/1991 | Japan . |

*Primary Examiner*—Jon Santamauro
*Attorney, Agent, or Firm*—Foley & Lardner

[57] ABSTRACT

A logic circuit has a signal line for transmitting a digital signal as a voltage level and a loop circuit serving as a memory unit for storing the digital signal. Input and output terminals of the loop circuit are connected to the signal line. The loop circuit is a partial circuit having an even number (at least two) of signal inverters each having capacitive input load. At least one of the input and output terminals of the loop circuit is connected to an electric resistor. The loop circuit has a time constant T that is determined by the product RC of the resistance R of the resistor and the intentional and parasitic capacitance C of the signal inverters. The time constant T has a given relationship with the operation frequency of the logic circuit. The resistance R and capacitance C form a low-pass filter. The logic circuit provides different equivalent circuits in high and low frequency regions above and below the cutoff frequency of the low-pass filter. Namely, the logic circuit operates as a static circuit at low speed to surely keep data and as a dynamic circuit at high speed.

8 Claims, 17 Drawing Sheets

LOGIC CIRCUIT

BACKGROUND OF THE INVENTION

1. Field of the Invention

The present invention relates to a logic circuit that processes digital data in voltage levels, and particularly, to a semiconductor integrated logic circuit.

2. Description of the Prior Art

FIG. 1 shows logic circuits L1 to Ln connected to a node P according to a prior art. A digital signal "a" is branched at the node P and simultaneously transferred to the logic circuits. The logic circuits L1 to Ln involve input capacitance values C1 to Cn, respectively, which act as load capacitances on the digital signal "a." In practice, some of the logic circuits L1 to Ln allow a delay in receiving the digital signal "a." Even for such logic circuits, the prior art uniformly allocates minimum capacitance depending on specific design rules or manufacturing processes. As a result, the digital signal "a" is subjected to load capacitance that is unnecessarily large.

Namely, the digital signal "a" is subjected to the minimum input load capacitance, which is determined by manufacturing processes, multiplied by the number of the logic circuits. Even if some of the logic circuits are not required to operate at high speed (high frequency), they are each designed to have load capacitance acting on the signal "a," to hinder the operation speed of the other logic circuits that are required to operate at high speed.

Any conventional semiconductor circuit is unable to have both dynamic and static characteristics. Memories with MOS transistors are classified into dynamic memories and static memories. The dynamic memories use the characteristics of MOS transistors of realizing high impedance and store data by accumulating charge in parasitic capacitors or in designed storage capacitors. The static memories employ feedback circuits to actively store data. FIG. 2 shows a dynamic D flip-flop as an example of the dynamic memories, and FIG. 3 shows a static D flip-flop as an example of the static memories.

The dynamic memories have a simple structure as shown in FIG. 2, and therefore, are capable of operating at high speed. The dynamic memories store data by accumulating charge in capacitors and are unable to keep the data for a long time because of a leakage of charge. The dynamic memories have, therefore, a minimum operation frequency. This restricts the degrees of freedom in the dynamic memory designs. A CMOS circuit, one of the circuit for dynamic memories, consumes power in proportion to an operation frequency, and to reduce the power dissipation, it is desirable to decrease the operation frequency thereof, or to suspend the operation thereof when not urgent or when not needed. Such reduction or suspension of operation is restricted by the minimum operation frequency of the CMOS circuit. Testing a circuit and examining trouble in the course of the research and development of the circuit are restricted by the minimum operation frequency of the circuit. The fact whether the circuit is able to or unable to suspend influences the efficiency of the system development. Since the operation of the dynamic memories is unable to suspend due to the minimum operation frequency, there is a serious problem in finding the cause of a malfunction in the dynamic memories.

The static memories structurally store data. For example, they have feedback circuits to hold data, and therefore, the static memories have no minimum operation frequency. They keep data even if they are stopped, as long as source power is supplied thereto. The static memories, however, are large in size and not suitable for high-speed operation. Compared with the dynamic D flip-flop of FIG. 2, the static D flip-flop of FIG. 3 additionally has partial circuits 1 and 3 for statically storing data, and these partial circuits slow down the operation speed of the flip-flop when they are charged and discharged.

Consequently, an ideal semiconductor integrated circuit is "a dynamic-static circuit" that is capable of operating at high speed without a minimum operation frequency. Namely, it operates dynamically at high speed and statically at low speed. There is, however, no prior art that provides such an ideal circuit. "The dynamic-static circuit" may be usable not only for storing data but also for other purposes. For example, it could be applicable to a logic circuit having a precharger as shown in FIG. 4. This kind of logic circuit accumulates, during a precharge period, charge at each node to indicate a logic value, carries out a logic operation during an evaluation period, inverts the logic value of any node if it is unsuitable, and keeps the logic value of any node if it is suitable. Inverting a logic value is carried out by discharging a corresponding node. However, keeping a logic value is carried out with the use of a dynamic or a static circuit, and there was no "dynamic-static logic circuit" having a precharger. Actually, FIG. 4 shows an example of a dynamic logic circuit according to a prior art. This circuit is incapable of operating dynamically at high speed and statically at low speed.

FIG. 5 shows an exclusive OR (EOR) circuit having pass transistors. This circuit is required to operate at high speed without producing a short current. When inputs A and B are at a source voltage, the voltage of a node "b" is dropped from the source voltage by the threshold voltage $V_{th}$ of an n-channel MOS transistor. This voltage drop due to the threshold voltage of the pass transistor causes a p-channel MOS transistor of a CMOS inverter 5 to insufficiently turn off, thereby steadily passing a short current. To avoid this problem, another prior art has proposed a circuit of FIG. 6. When the potential at a node "c" exceeds a given voltage, a feedback circuit works to increase the potential of the node "c" to a source voltage, to prevent a short current in a CMOS inverter 7. The feedback circuit, however, prevents inputs A and B from falling down to a ground level, thereby preventing high-speed operation. Hence, we can conclude that there has been no prior art that realizes high-speed operation without producing a steady short current.

As explained above, the prior art that branches a digital signal to plural logic circuits including high-speed and low-speed circuits uniformly allocates input capacitance to each of the high-speed and low-speed logic circuits, so that the digital signal is subjected to the input capacitance multiplied by the number of the logic circuits. This prior art is incapable of improving the operation speed of the high-speed logic circuits because it is unable to reduce load capacitance on those of the high-speed logic circuits that must operate at high speed.

There is no prior art that provides "a dynamic-static circuit" having both dynamic and static characteristics.

There is no prior art that provides a circuit capable of operating at high speed without producing a steady short current.

SUMMARY OF THE INVENTION

An object of the present invention is to provide a logic circuit capable of statically keeping data at low speed and dynamically operating at high speed.

Another object of the present invention is to provide a logic circuit capable of operating at high speed without producing a short current.

Still another object of the present invention is to provide high- and low-speed logic circuits that commonly receive a digital signal without a bad influence of the low-speed logic circuits on the high-speed logic circuits.

In order to accomplish the objects, the present invention opposes the design principles in the prior arts that try to minimize parasitic resistance when designing a logic circuit. The present invention designs a logic circuit with large electric resistance. FIGS. 7A, 8, 9, and 12 show logic circuits according to a first aspect of the present invention. Each of the logic circuits has a signal line for transmitting a digital signal as a voltage level, partial circuits 11A and 11B serving as memory means, and large electric resistors 291, 292, 293, 294, . . . , which serve as electric resistance means. Each of the partial circuits is a loop circuit having input and output terminals connected to the signal line and an even number (at least two) of signal inverting means such as CMOS inverters 212 and 213 (214 and 215) that are connected in a ring. Each of the signal inverting means inverts a voltage under a steady state and involves capacitive input load. The input and output terminals of each partial circuit are connected to the electric resistance means 291 and 292 (293 and 294).

The partial circuit 11A (11B) has time constants T1 and T2. T1 is determined by the product of the resistance of the resistors 292 (294) and the input capacitance of the inverter 213 (215). The time constant T1 corresponds to the cutoff frequency of the input terminal of the partial circuit 11A (11B). T2 is also defined by the product of the resistance and the capacitance around the output terminal of the partial circuit 11A (11B). Here, the resistance is a summation of the resistance of the resistor 291 (293) and the ON-resistance of the inverter 212 (214). The capacitance is a total of parasitic capacitances on the node NA (NB) including the input capacitance of the inverter 202 (203). The time constant T2 corresponds to the cutoff frequency of the output terminal of the partial circuit 11A (11B). If no signal to rewrite the data stored in the partial circuit 11A (11B) is supplied for a period sufficiently longer than the time constants T1 and T2, the data is statically kept in the partial circuit 11A (11B). If a signal to rewrite the data stored in the partial circuit 11A (11B) is supplied within the time constants T1 and T2, the logic circuit operates as if the partial circuits 11A and 11B are disconnected from the nodes NA and NB, respectively. At this time, the logic circuit operates dynamically to transmit the signal at high speed.

In this way, the first aspect of the present invention proposes a novel design theory that defies common sense by inserting large resistors in a logic circuit. The low-pass filters correspond to the time constants T1 and T2 are formed or enhanced by introducing the intentional resistors 291–294, and the logic circuit provides different equivalent circuits below and above the cutoff frequencies of the low-pass filter. Namely, the logic circuit operates like a static circuit to store data when it operates below the cutoff frequency, and like a high-speed dynamic circuit when it operates above the cutoff frequency.

FIGS. 18 and 19 show logic circuits according to a second aspect of the present invention. Each of the logic circuits expresses digital data in voltage levels and has at least signal amplifying means such as an amplifier 301 and signal switching means such as a switching device 311. The output of the amplifier 301 controls the switching device 311, to operate a charge retention circuit 31 (32). Electric resistors 391 and 392 are inserted between the charge retention circuit 31 (32) and the amplifier 301 at positions that never interfere with a main signal line that must transmit a signal at high speed. The amplifier 301 is an inverter such as a CMOS inverter, and the switching device 311 is a p-channel MOS transistor.

The charge retention circuit 31 has time delays T1 and T2. T1 is determined by the product of the resistance of the resistor 391 and the input capacitance of the switching device 311. The time constant T1 corresponds to the cutoff frequency of the input terminal of the circuit 31. T2 is also defined by the product of the resistance and the capacitance around the output terminal of the circuit 31. Here, the resistance is a summation of the resistance of the resistor 392 and the ON-resistance of the switching device 311. The capacitance is a total of parasitic capacitances on the node N including the input capacitance of the amplifier 301. The time constant T2 corresponds to the cutoff frequency of the output terminal of the circuit 31. Due to the time delays T1 and T2, the charge retention circuit 31 is disconnected from the logic circuit when the logic circuit operates at high frequency (high speed). Namely, when a digital signal to the logic circuit changes at high speed, the logic circuit operates dynamically, and the charge retention circuit never interferes with a change in the digital signal. When the frequency of a signal to the logic circuit is longer than the time delays T1 and T2, the charge retention circuit operates statically.

FIG. 20 shows a logic circuit according to a third aspect of the present invention. This logic circuit expresses digital data in voltage levels. The logic circuit has a compensation circuit 41 for compensating an output voltage so that it has an optimum level, if the potential level of the output voltage is insufficient. The compensation circuit 41 is a loop circuit consisting of at least signal amplifying means 401 and signal switching means 411. Electric resistance means 491 and 492 are inserted in signal lines except a forward signal line in the compensation circuit 41. The logic circuit is a CMOS logic circuit, the signal amplifying means 401 may be an inverter such as a CMOS inverter, and the signal switching means 411 may be a p-channel MOS transistor.

The charge retention circuit 41X has time delays T1 and T2. T1 is determined by the product of the resistance of the resistor 491 and the input capacitance of the switching means 411. The time constant T1 corresponds to the cutoff frequency of the input terminal of the circuit 41X. T2 is also defined by the product of the resistance and the capacitance around the output terminal of the circuit 41X. Here, the resistance is a summation of the resistance of the resistor 492 and the ON-resistance of the switching means 411. The capacitance is a total of parasitic capacitances on the node "c" including the input capacitance of the amplifying means 401. The time constant T2 corresponds to the cutoff frequency of the output terminal of the circuit 41X. Due to the time delays T1 and T2, the charge retention circuit 41X is substantially disconnected from the logic circuit when a digital signal to the logic circuit changes at high frequency. When the frequency of a signal to the logic circuit is low, the compensation circuit 41 operates normally. If there was no compensation circuit 41, the potential level of a node "c" may be decreased by the threshold voltage $V_{th}$ of pass transistors 471 and 472. To compensate the decrease, the signal switching means 411 is turned on to surely turn off a p-channel MOS transistor in the signal amplifying means 401, thereby preventing a steady short current in the signal amplifying means 401 and reducing power dissipation.

FIG. 22 shows a system according to a fourth aspect of the present invention. The system has a signal line for transmitting a digital signal "a" that is a voltage level generated by a signal generation means, and signal reception means such as logic circuits L1 to Ln connected in parallel with one another to receive the digital signal. The digital signal is branched at a node P and simultaneously supplied to the logic circuits L1 to Ln. The logic circuits have input capacitance values C1 to Cn, respectively. Electric resistance means 9, which is characteristic to the fourth aspect, is connected to an input terminal of, for example, the logic circuit L1 when the logic circuit L1 is not required to operate at high speed (high frequency) and when the other logic circuits are required to operate at high speed.

The electric resistance means 9 limits a current to the logic circuit L1 and causes the logic circuit L1 to receive a signal after a delay time that is determined by a time constant T=RC (the product of the resistance R of the electric resistance means 9 and the input capacitance C of the logic circuit L1). Due to this, the other logic circuits L2 to Ln receive more current to improve their operation speed. Namely, the logic circuits L2 to Ln each having a time constant faster than the time constant T can ignore the input impedance of the logic circuit L1 having the time constant T. A signal that is faster than the time constant T is transmitted only to the logic circuits L2 to Ln that are not provided with the electric resistance means 9. At this time, the logic circuit L1 that is not required to operate at high speed is substantially disconnected from the other logic circuits, to reduce load impedance on the other circuits and improve their operation speed. After the delay time, the logic circuit L1 receives and processes the digital signal. The electric resistance means 9 and the input capacitance C1 of the logic circuit L1 form a low-pass filter, and the system provides different equivalent circuits to differently transmit signals below and above the cutoff frequency of the low-pass filter.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
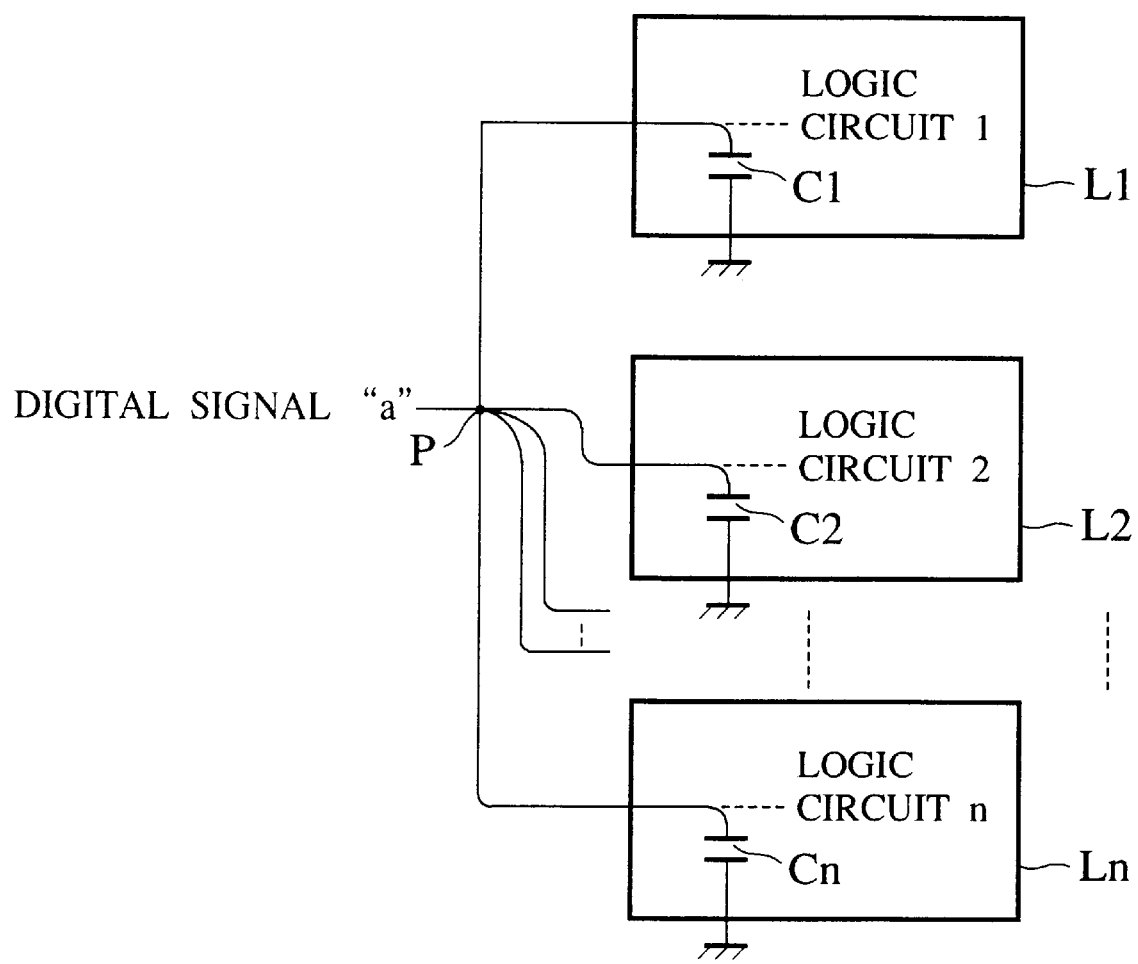
FIG. 1 shows logic circuits according to a prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 2:
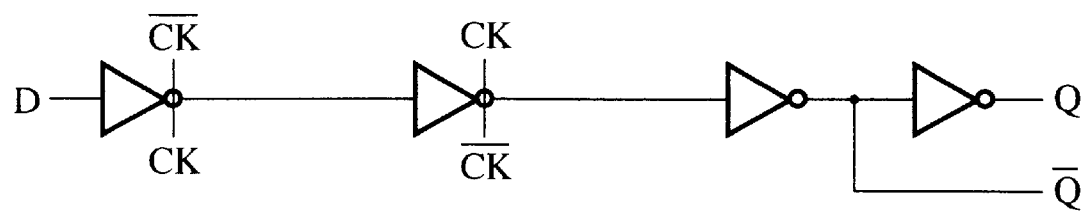
FIG. 2 shows a dynamic D flip-flop according to a prior art.
Figure 3:
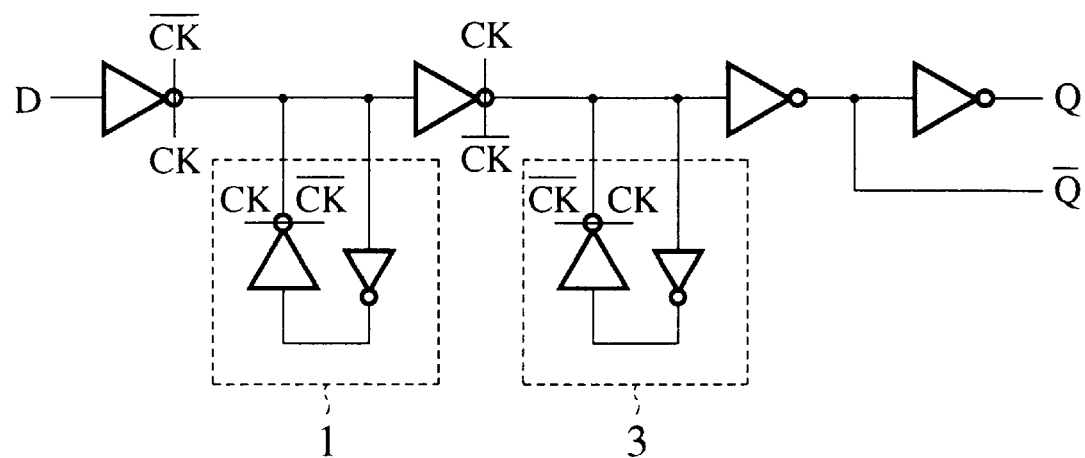
FIG. 3 shows a static D flip-flop according to a prior art.
Figure 7A:
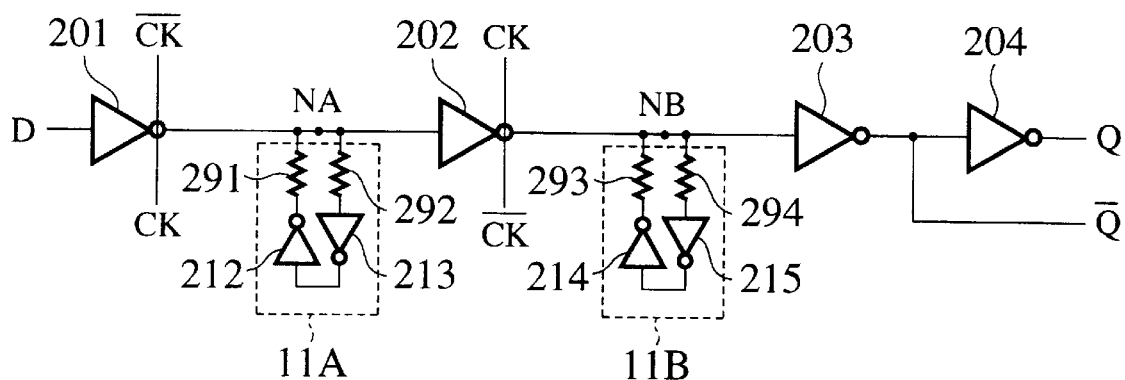
FIG. 7A shows a flip-flop according to a first embodiment of the present invention.
Figure 7B:
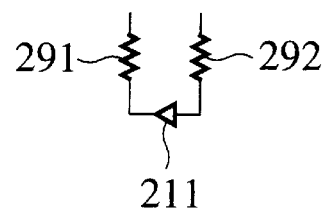
FIG. 7B shows a partial circuit serving as a memory unit according to a modification of the first embodiment.
Figure 7C:
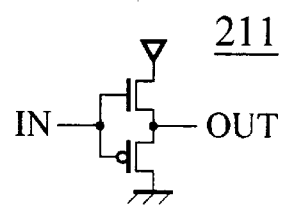
FIG. 7C shows a buffer of the circuit of FIG. 7B.

FIG. 7A shows a flip-flop according to the first embodiment of the present invention. A partial circuit 11A is a loop circuit arranged between inverters 201 and 202, and a partial circuit 11B is a loop circuit arranged between inverters 202 and 203. Each of the partial circuits has two kinds of time constants T1 and T2. T1 is determined by the product of the resistance of resistors 292 (294) and the input capacitance of the inverter 213 (215). T2 is also defined by the product of the resistance and the capacitance around the output terminal of the partial circuit 11A (11B). Here, the resistance is a summation of the resistor 291 (293) and the ON-resistance of the inverter 212 (214). The capacitance is a total of parasitic capacitances on the node NA (NB) including the input capacitance of the inverter 202 (203). These time constants T1 and T2 are sufficiently larger than the time corresponding to the operation speed of the flip-flop. The partial circuits 11A and 11B mainly consist of CMOS circuits. The resistors disconnect the partial circuits from the flip-flop when the flip-flop is operated at high speed (high frequency). In this case, the flip-flop becomes identical to the high-speed dynamic D flip-flop of FIG. 2. When the flip-flop of FIG. 7A is operated at low speed (low frequency), the resistors do not disconnect the partial circuits from the flip-flop. Accordingly, the flip-flop operates as a static circuit to keep data even if a clock signal is stopped. A direct current component in a CMOS inverter is ignorable by the nature of CMOS circuit, and therefore, the resistors 291 to 294 in the flip-flop are ignorable when the operation speed of the flip-flop is sufficiently longer than the time constants T1 and T2. FIG. 7B shows a buffer 211 corresponding to the two inverters 212 and 213 of the partial circuit 11A of FIG. 7A. FIG. 7C shows a CMOS circuit serving as the buffer 211 of FIG. 7B.

Figure 8:
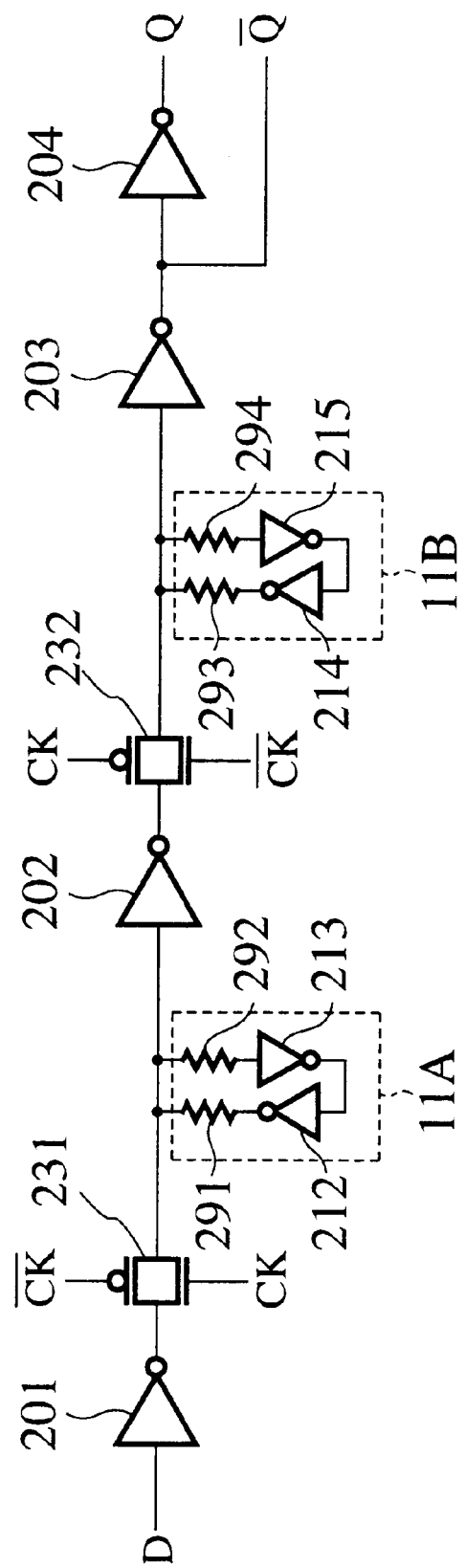
FIG. 8 shows another flip-flop according to the first embodiment.

FIG. 8 shows another flip-flop according to the first embodiment of the present invention. The flip-flop has a signal line for transmitting a digital signal. The signal line involves switching devices 231 and 232 each consisting of a p-channel MOSFET and an n-channel MOSFET, and CMOS inverters 201, 202, 203 and 204. Partial circuits 11A and 11B are connected to the signal line. The partial circuit 11A is a loop circuit consisting of inverters 212 and 213 and electric resistors 291 and 292. The partial circuit 11B is a loop circuit consisting of inverters 214 and 215 and electric resistors 293 and 294. Each of the partial circuits has two kinds of time constants T1 and T2. T1 is determined by the product of the resistance of resistors 292 (294) and the input capacitance of the inverter 213 (215). T2 is also defined by the product of the resistance and the capacitance around the output terminal of the partial circuit 11A (11B). Here, the resistance is a summation of the resistance of the resistor 291 (293) and the ON-resistance of the inverter 212 (214). The capacitance is a total of parasitic capacitances on the node NA (NB) including the input capacitance of the inverter 202 (203). The time constants T1 and T2 are set to be sufficiently large so that the resistors 291 to 294 may disconnect the partial circuits 11A and 11B from the flip-flop when the flip-flop is operated at high speed. In this case, the flip-flop becomes similar to the high-speed dynamic D flip-flop of FIG. 2. When the flip-flop is operated at low speed, the resistors do not disconnect the partial circuits 11A and 11B from the flip-flop, and therefore, the flip-flop operates as a static circuit, which withstands noise from another circuit.

Figure 9:
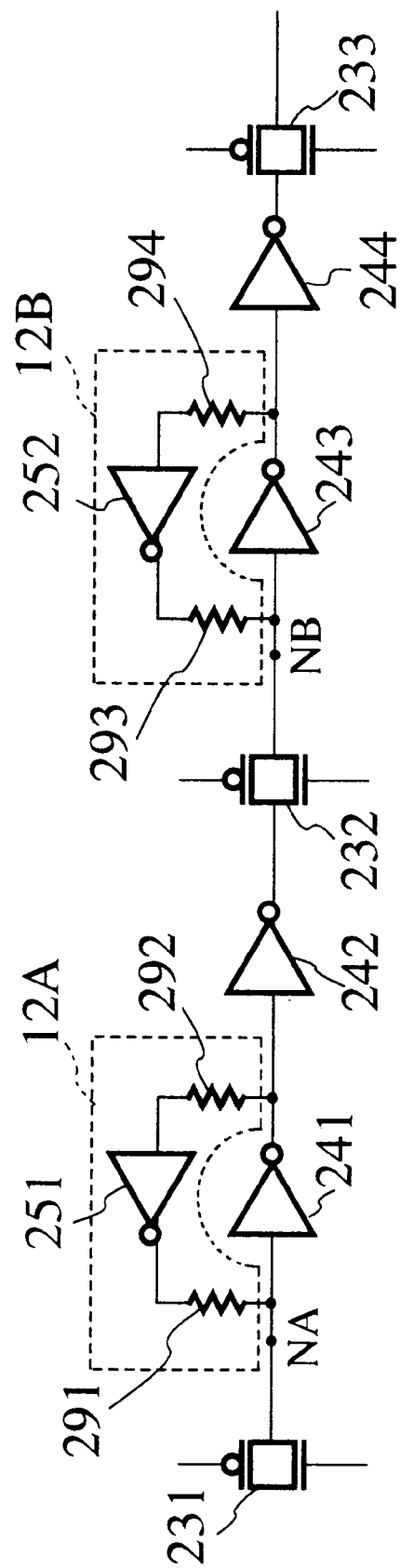
FIG. 9 shows still another flip-flop according to the first embodiment.

FIG. 9 shows another flip-flop (latch) according to the first embodiment of the present invention. The latch has a signal line for transmitting a digital signal. The signal line involves switching devices 231, 232, and 233 each consisting of a p-channel MOSFET and an n-channel MOSFET, and inverters 241 to 244. Partial circuits 12A and 12B are connected to the signal line. The partial circuit 12A consists of an inverter 251 and electric resistors 291 and 292. The partial circuit 12B consists of an inverter 252 and electric resistors 293 and 294. Each of the partial circuits has time constants T1 and T2. T1 is determined by the product of the resistance of the resistors 292 (294) and the input capacitance of the inverter 251 (252). T2 is also defined by the product of the resistance and the capacitance around the output terminal of the partial circuit 12A (12B). Here, the resistance is a summation of the resistance of the resistor 291 (293) and the ON-resistance of the inverter 251 (252). The capacitance is a total of parasitic capacitances on the node NA (NB) including the input capacitance of the inverter 241 (243). The time constants T1 and T2 are set to be sufficiently large so that the resistors 291 to 294 may disconnect the partial circuits 12A and 12B from the latch circuit when the latch is operated at high speed. In this case, the latch becomes similar to the high-speed dynamic D flip-flop of FIG. 2. When the latch is operated at low speed, the resistors do not disconnect the partial circuits from the latch, and therefore, the latch operates as a static circuit.

Figure 10A:
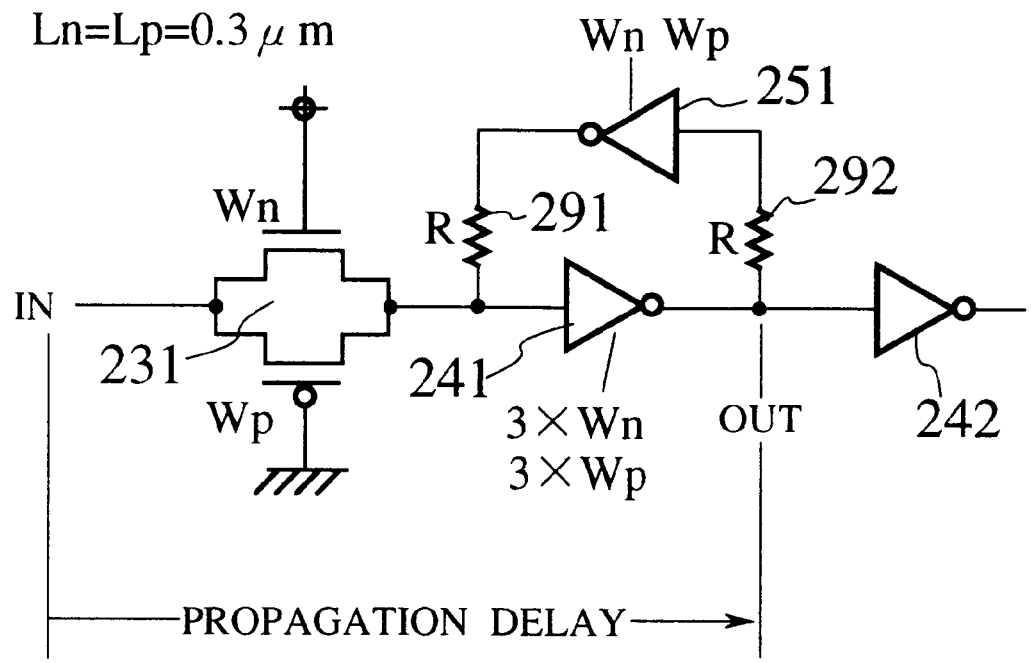
FIGS. 10A and 10B show the details of the flip-flop of FIG. 9 and illustrate the propagation delay.
Figure 10B:
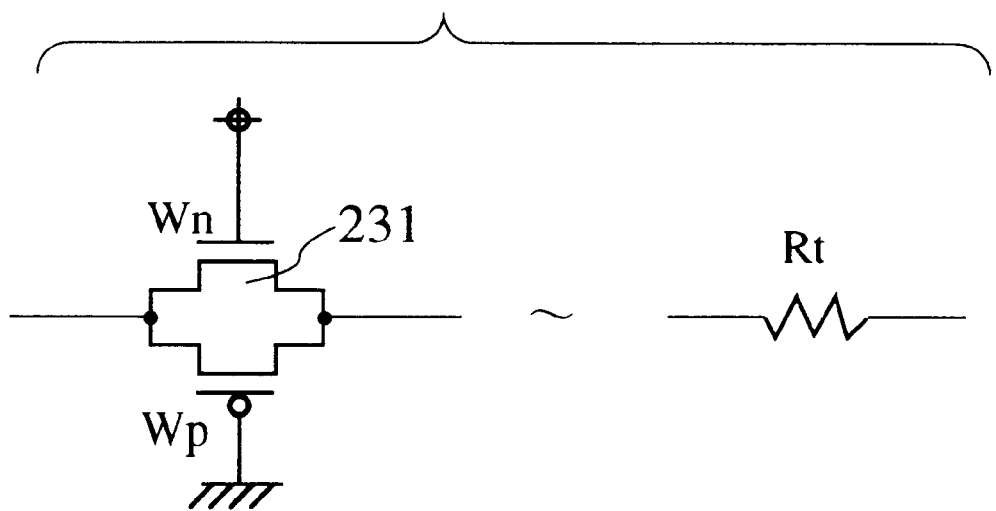
Figure 11:
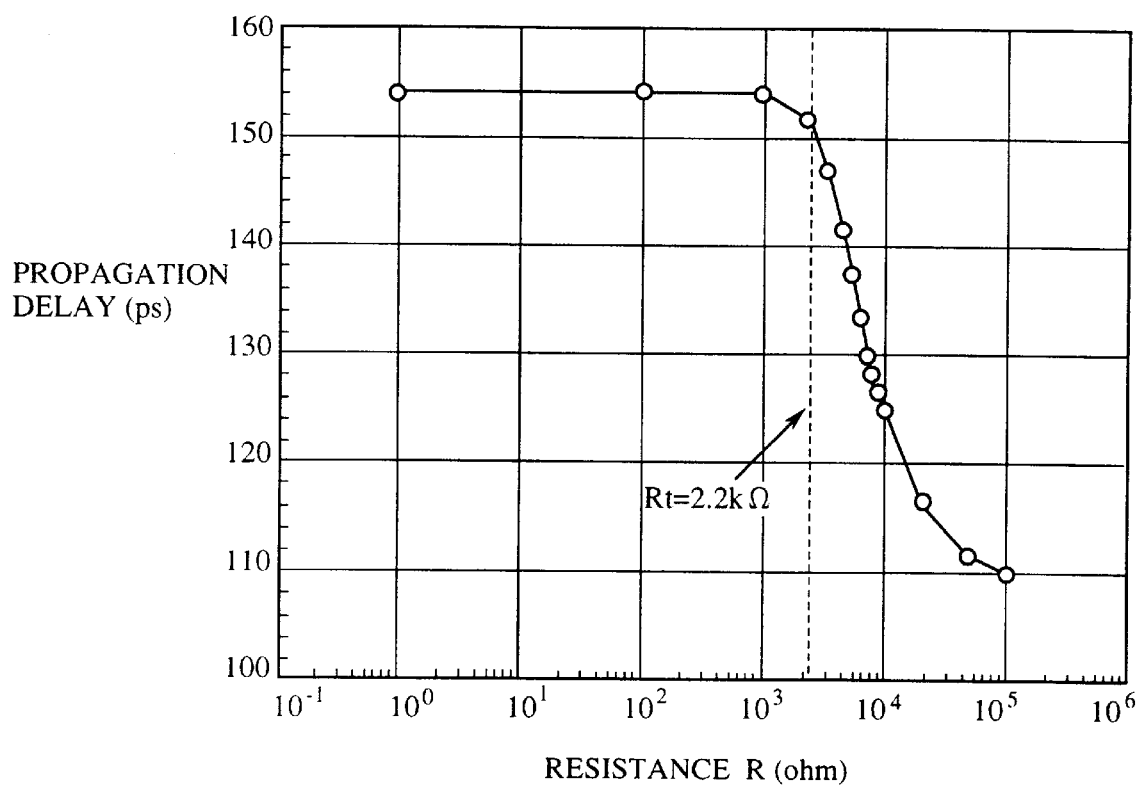
FIG. 11 shows the resistance dependency of the propagation delay characteristics of the flip-flop of FIG. 9.

FIGS. 10A, 10B and 11 illustrate the shortening of the propagation delay by varing the value of the resistors 291 to 294. FIG. 10A shows a part of the circuit of FIG. 9. FIG. 11 shows the relationship between the propagation delay time and the resistance R, the delay time is defined as a time that a signal propagate between the input of the switching device 231 and the output of the inverter 241 as shown in FIG. 10A. The gate widths Wn and Wp of the CMOS inverter 241 are three times as wide as the gate widths Wn and Wp of the CMOS inverter 251. Although it may be dependent on the value of parasitic capacitance and resistance (ON resistance) in the loop circuits 11A and 11B, the propagation delay time is reduced when the resistance R is greater than 2 kilo-ohms for the case that the equivalent ON resistance Rt of the switching device 231 being 2.2 kilo-ohms. Here, the resistance of each of the resistors 291 and 292 is set to be R.

Figure 12:
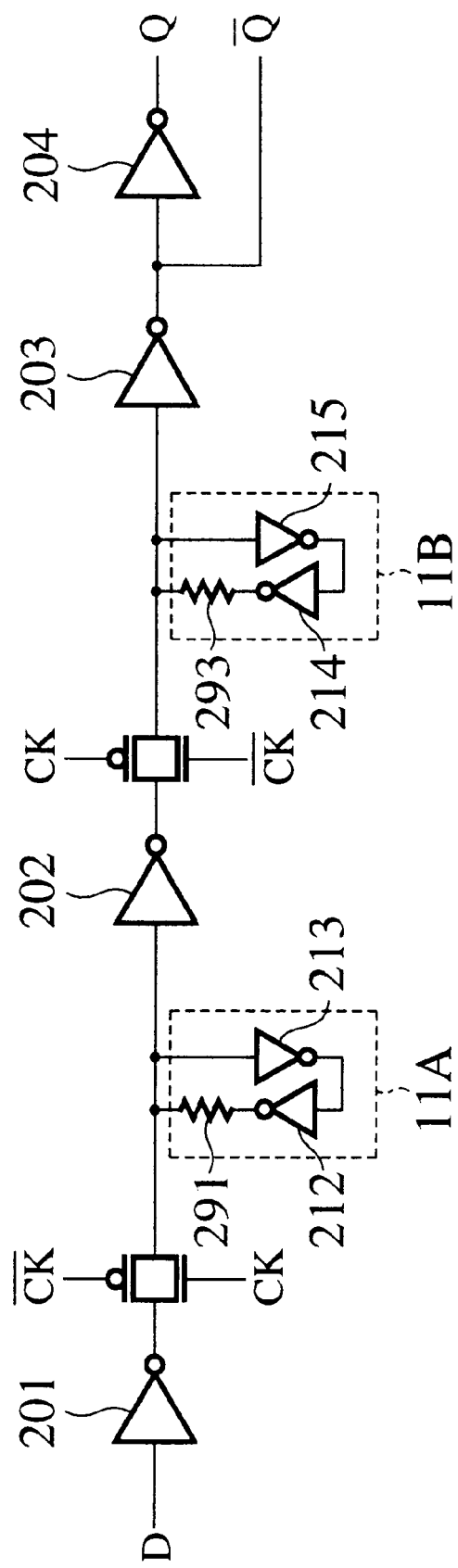
FIG. 12 shows still another flip-flop according to the first embodiment.
Figure 13A:
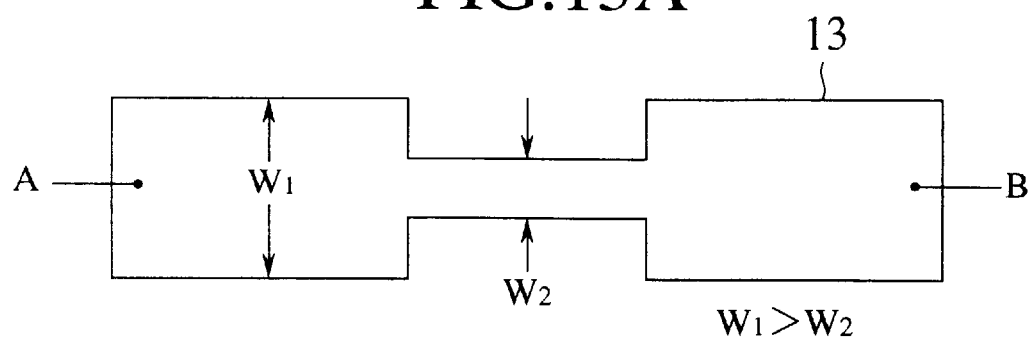
FIG. 13A explains the art of adjusting the width of a conductor to provide required resistance according to the present invention.
Figure 13B:
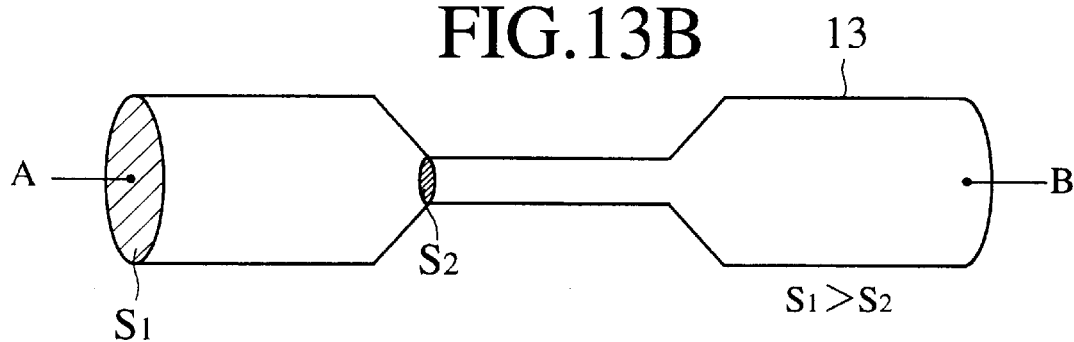
FIG. 13B explains the art of reducing the cross-sectional area of a conductor to provide required resistance according to the present invention.
Figure 13C:
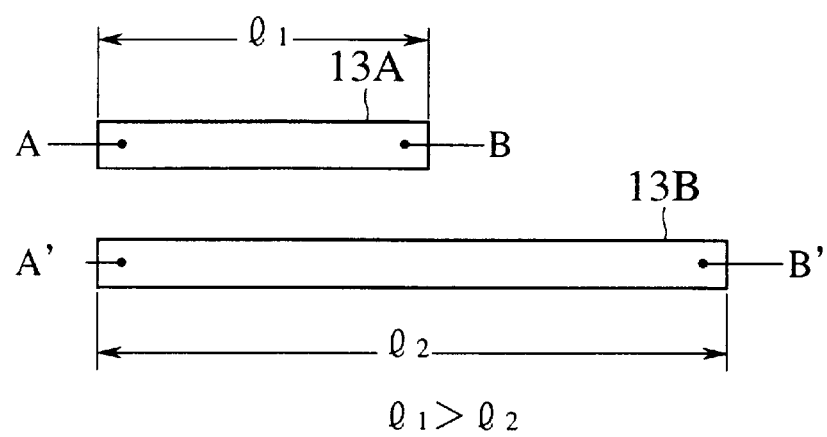
FIG. 13C explains the art of elongating a conductor to provide required resistance according to the present invention.
Figure 14A:
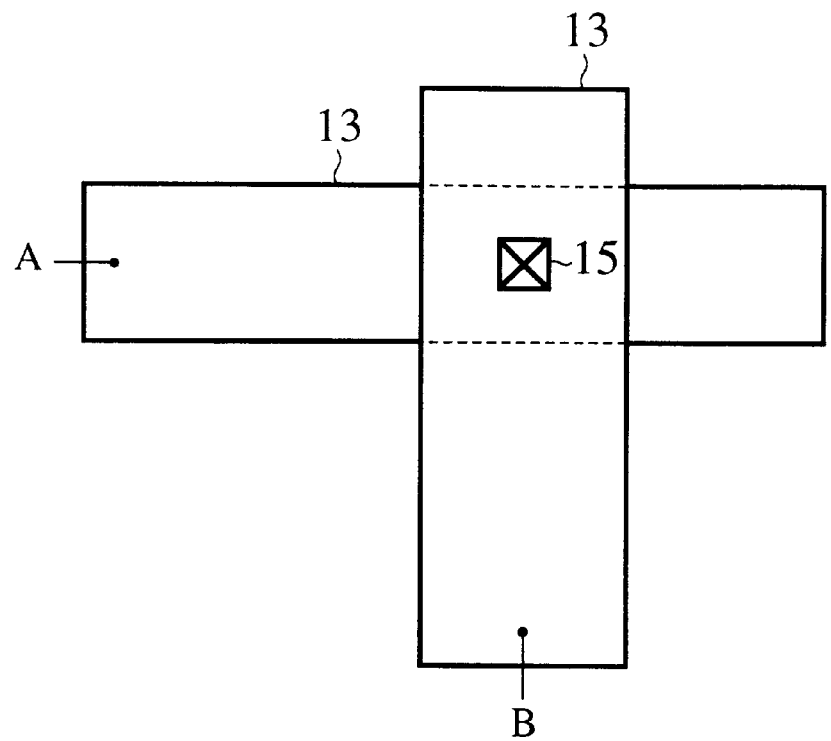
FIG. 14A explains the art of reducing the area of a contact hole to provide required resistance according to the present invention.
Figure 14B:
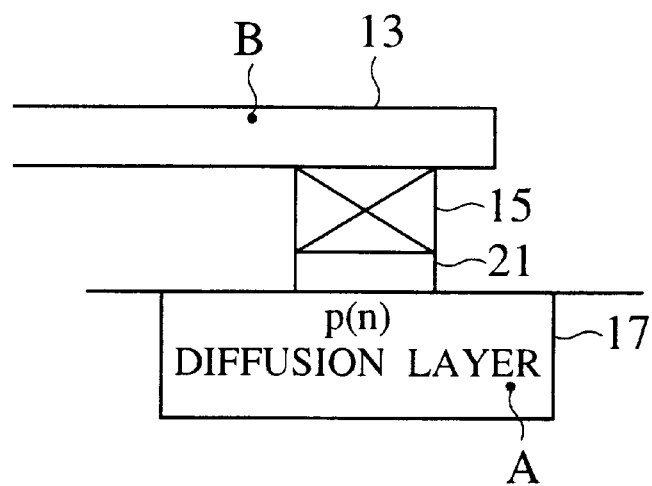
FIG. 14B explains the art of providing high resistance by employing barrier metal in a contact hole according to the present invention.

FIG. 12 shows still another flip-flop according to the first embodiment of the present invention. A partial circuit 11A is a loop circuit having an electric resistor 291 and inverters 212 and 213, the resistor 291 being connected to the output of the inverter 212. A partial circuit 11B is a loop circuit having an electric resistor 293 and inverters 214 and 215, the resistor 293 being connected to the output of the inverter 214. An equivalent circuit of the flip-flop at high-speed operation is not a complete dynamic circuit, and therefore, is inferior to the flip-flops of FIGS. 7A, 8, and 9. The flip-flop of FIG. 12, however, is advantageous in the number of elements. When operating at low speed, the flip-flop of FIG. 12 is equal to a static circuit and operates faster than the conventional static circuits. The flip-flop of FIG. 12, therefore, is ready for new applications.

FIGS. 13 to 17 show the electric resistance means of the present invention, any one of which is formed on a semiconductor chip and is used as an element of a semiconductor integrated circuit according to the first embodiment of the present invention. To increase the electric resistance of a resistor formed from a conductor having specific resistivity, it is necessary to elongate the length of the conductor and reduce the cross-sectional area of the same. FIG. 13A shows a resistor made of a conductor 13. The conductor 13 has a width W1 and is partly narrowed to a width W2 (W1>W2) to provide high resistance. Thinning a conductor to a thickness which will not cause the disconnection and reducing the effective cross-sectional area thereof also increases the resistance of the conductor. FIG. 13B shows a conductor 13 having such a small cross-sectional area S2. Part of the conductor 13 having a predetermined cross-sectional area S1 is reduced to a cross-sectional area S2 (S1>S2) to provide high resistance. FIG. 13C shows a conductor 13A having a length l1, and a conductor 13B having a length l2. The longer the length of a conductor, the higher the resistance thereof if the width and thickness thereof are unchanged. FIG. 14A shows two conductors that are formed on different wiring layers with an inter-layer insulator being formed between them. A contact hole 15 is formed in the inter-layer insulator, to connect the two conductors to each other. The area of the contact hole 15 may be reduced to increase contact resistance, thereby providing high electric resistance. FIG. 14B shows a metal conductor 13 made of, for example, aluminum connected to an n- or p-type diffusion layer 17 through a contact hole 15. Conductor buried in the contact hole 15 provides high electric resistance. Generally speaking, a barrier metal is the metal formed in an interface between the metal in the contact hole 15 and the semiconductor diffusion layer 17, to prevent a metal spike or a high-resistance alloy piping from being formed due to poor direct contact between the semiconductor and the metal, and is alloyed to obtain low ohmic contact resistance, as a rule. However, in the present invention, the barrier metal 21 is made of, for example, titanium (Ti) or platinum (Pt) and is formed without alloying, to realize high resistance. The barrier metal 21 may be replaced with the same material as the conductor in the contact hole 15, or with material that realizes high contact resistance by direct contact with silicon, thereby providing high electric resistance.

Figure 15A:
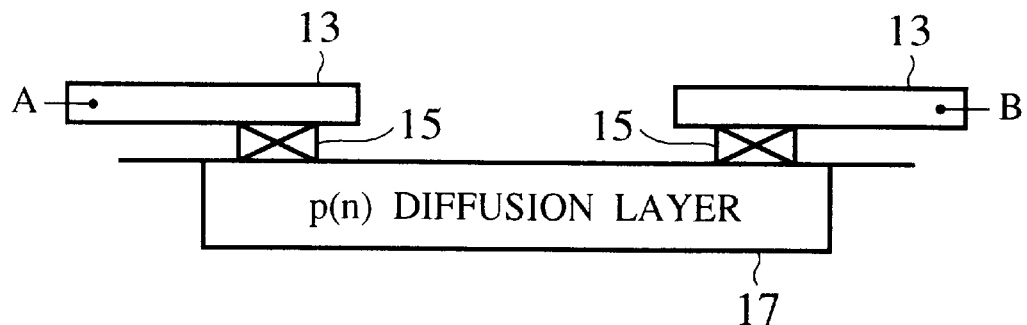
FIG. 15A explains the diffused resistor in a semiconductor substrate to provide required resistance according to the present invention.
Figure 15B:
FIG. 15B explains polycrystalline silicon or refractory metal resistor according to the present invention.

Using a conductor having high specific resistivity is also effective to provide high electric resistance. FIG. 15A shows a resistor formed by diffusing impurities into semiconductor material. The diffused resistor 17 is formed by selectively diffusing impurities such as phosphorus (P), arsenic (As), antimony (Sb), or boron (B) into a silicon semiconductor substrate according to photolithography and ion implantation (or predeposition) so that electrons or holes cause electric conduction. The resistivity of the diffused resistor 17 is higher than that of a metal conductor 13 made of, for example, aluminum. The resistivity of the resistor 17 may optionally be set by selecting the concentration of the impurities. Required resistance is obtainable by connecting the two conductors 13, which are formed on a field insulation film formed on the diffused layer 17, through the diffused resistor 17 to one another via contact holes 15 that are formed in the field insulation film. FIG. 15B shows a polycrystalline silicon resistor 19 containing impurities. Doped polycrystalline silicon (hereinafter called "DOPOS") is widely used to form the gate electrode of an FET. The resistance of DOPOS is higher than that of metal such as aluminum, to provide high electric resistance. The resistance of the DOPOS resistor 19 is optionally changeable by selecting the concentration of impurities to be doped to polycrystalline silicon. Instead of DOPOS, refractory metal such as tungsten (W) and molybdenum (Mo), or silicide or polycide thereof such as $WSi_2$ and $MoSi_2$ having high resistivity may be used.

Figure 16A:
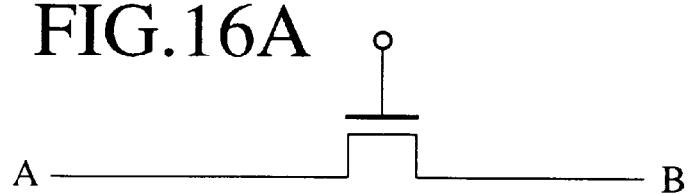
FIG. 16A explains the active resistor employing a field-effect transistor (FET) to provide required resistance according to the present invention.
Figure 16B:
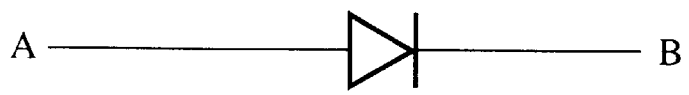
FIG. 16B explains the active resistor using a junction diode to provide required resistance according to the present invention.
Figure 16C:
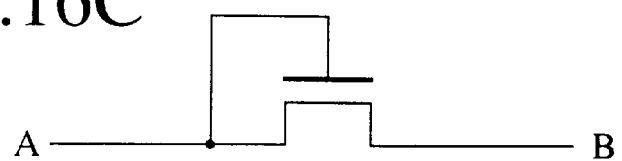
FIG. 16C explains the active resistor using the channel resistance of an FET serving as a diode to provide required resistance according to the present invention.
Figure 17A:
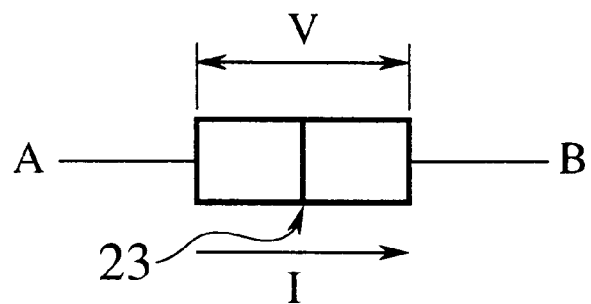
FIG. 17A explains a barrier formed at a heterojunction to provide required resistance according to the present invention.
Figure 17B:
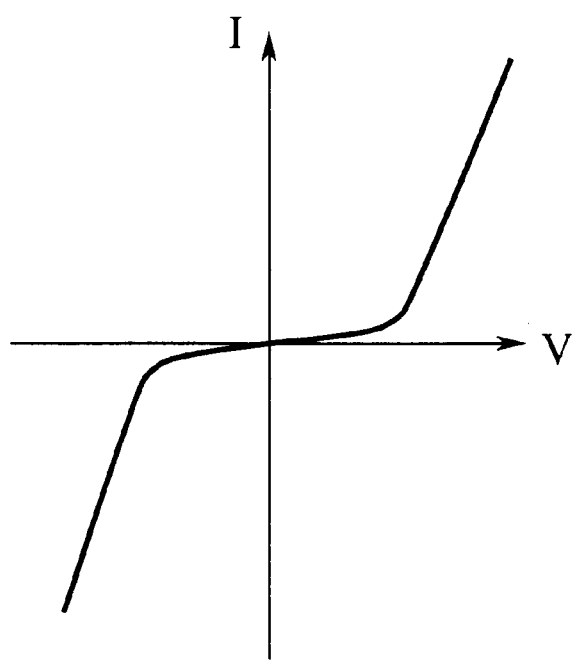
FIG. 17B shows the I–V characteristics of the heterojunction of FIG. 17A.

A functional element such as a diode or a transistor may be employed as a resistor having high resistance. FIG. 16A shows an active resistor using the channel resistance of an FET. The size of the channel resistance is controlled by a bias voltage applied to the gate electrode of the FET, to provide a wide range of resistance to be selected. FIG. 16B shows a junction diode whose reverse resistance is used as a resistor. FIG. 16C shows an active resistor made of an FET. The source or drain electrode of the FET is directly connected to the gate electrode thereof, to form a two-terminal element. This device operates like a diode and provides a wider range of resistance than the diode. FIG. 17A shows a resistor using a Schottky barrier formed in an interface 23 between metal and semiconductor having different work functions. The metal-semiconductor junction shows a nonlinear current-voltage characteristic curve of FIG. 17B that is used to provide a specific value of the resistance. The active resistor of FIG. 17A can provide high resistance with low applied voltage between the terminals A and B. And the resistance decreases drastically over a certain threshold voltage, or a built-in potential. Not only the Schottky barrier but also a Mott barrier, a tunnel barrier, and a heterojunction barrier may be formed in a current path, to provide high resistance. The first embodiment of the present invention may form resistors on a semiconductor chip according to any one of the techniques of FIGS. 13A to 17B depending on design specifications.

As explained above, the first embodiment provides a logic circuit having both dynamic and static characteristics that have never been realized by prior arts. The circuit of the first embodiment operates dynamically at high speed and statically at low speed. A conventional static circuit operates at low speed but with additional partial circuits that hinder high-speed operation. The present invention inserts resistors in the partial circuits of the static circuit, to restrict the charging and discharging currents to and from the partial circuits, thereby improving the operation speed of the static circuit. Although the operation speed of the partial circuits slows down due to the resistors, this causes no problem because the partial circuits are the circuits which serve only to secure low-speed operation.

In this way, the logic circuit according to the first embodiment of the present invention automatically acts dynamically during high-speed operation and statically during low-speed operation, which has a high immunity to noise.

(Second Embodiment)

Figure 18:
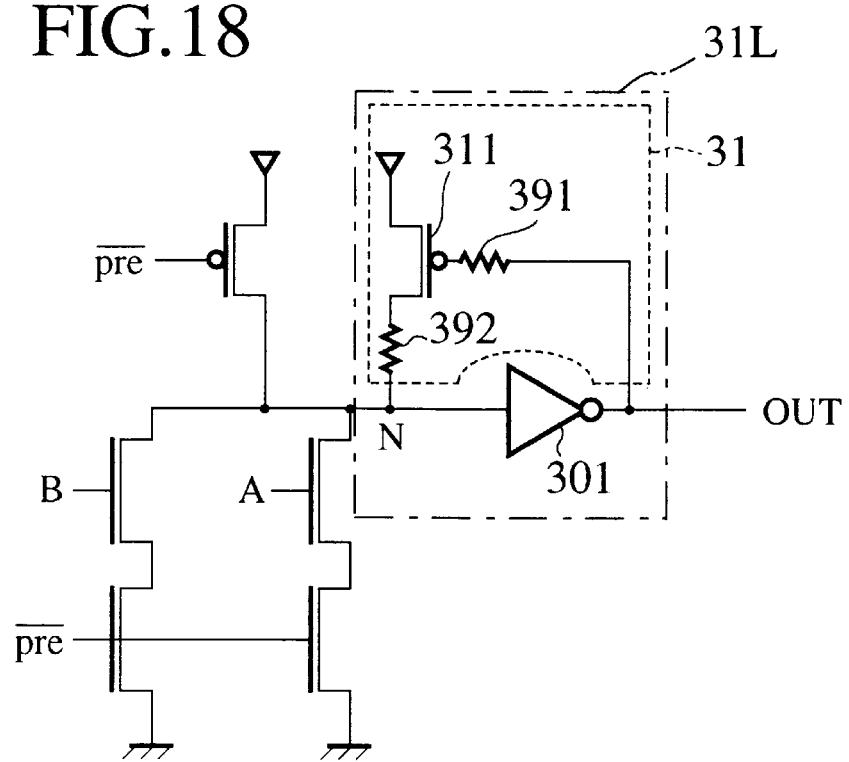
FIG. 18 shows a logic circuit having a precharger according to a second embodiment of the present invention.

FIG. 18 shows a logic circuit having a precharger according to the second embodiment of the present invention. This circuit accumulates charge at each node during a precharge period, to set the node to a logic value. The circuit carries out a logic operation during an evaluation period, inverts the logic value of any node if it is unsuitable, and keeps the logic value of any node if it is suitable. An output inverter 301 serving as an amplifier, an electric resistor 392 connected to the input of the inverter 301, an electric resistor 391 connected to the output of the inverter 301, and a p-channel MOS transistor 311 serving as a switching device form a closed loop circuit 31L.

This logic circuit inverts a logic value by discharging. The resistors 391 and 392 characteristic to the second embodiment are inserted in the loop circuit 31L not to interfere with a main signal propagation line.

Figure 4:
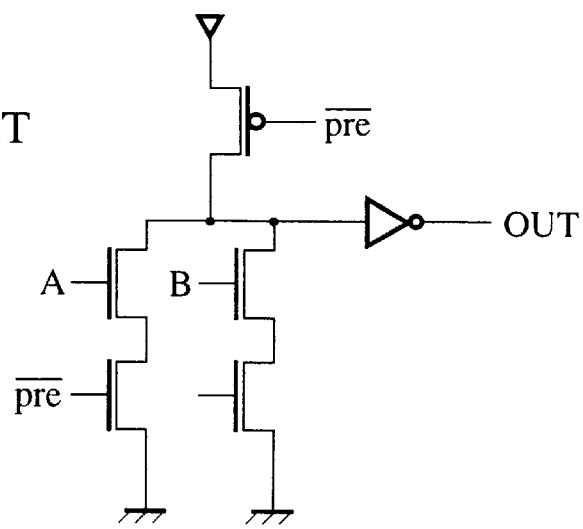
FIG. 4 shows a logic circuit having a precharger according to a prior art.

The charge retention circuit 31 has time constants T1 and T2. T1 is determined by the product of the resistance of the resistor 391 and the input capacitance of the switching device 311. T2 is also defined by the product of the resistance and the capacitance around the output terminal of the circuit 31. Here, the resistance is a summation of the resistance of the resistor 392 and the ON-resistance of the switching device 311. The capacitance is a total of parasitic capacitances on the node N including the input capacitance of the amplifier 301. The time constants T1 and T2 are set to be sufficiently large so that the charg retention circuit 31 is substantially disconnected from the operation of the logic circuit during high-speed operation. In this case, the logic circuit becomes identical to the high-speed dynamic logic circuit of FIG. 4. In low-speed operation, the resistors 391 and 392 do not disconnect the charge retention circuit 31 from the logic circuit, and therefore, the logic circuit operates as a static circuit to carry out feedback control to hold data even if a clock signal is stopped. Namely, during low-speed operation, the resistors 391 and 392 provide no effect on the logic circuit. The logic circuit of the second embodiment operates as a dynamic circuit at high speed and as a static circuit at low speed.

The resistors 391 and 392 are integrated on a semiconductor substrate similar to the first embodiment. Namely, the resistors 391 and 392 may be the diffused resistors, polycrystalline silicon resistors, metal thin film resistors, or contact resistors of the first embodiment. Alternatively, the resistors 391 and 392 may be the active resistors of FIGS. 16A to 17A.

Figure 19:
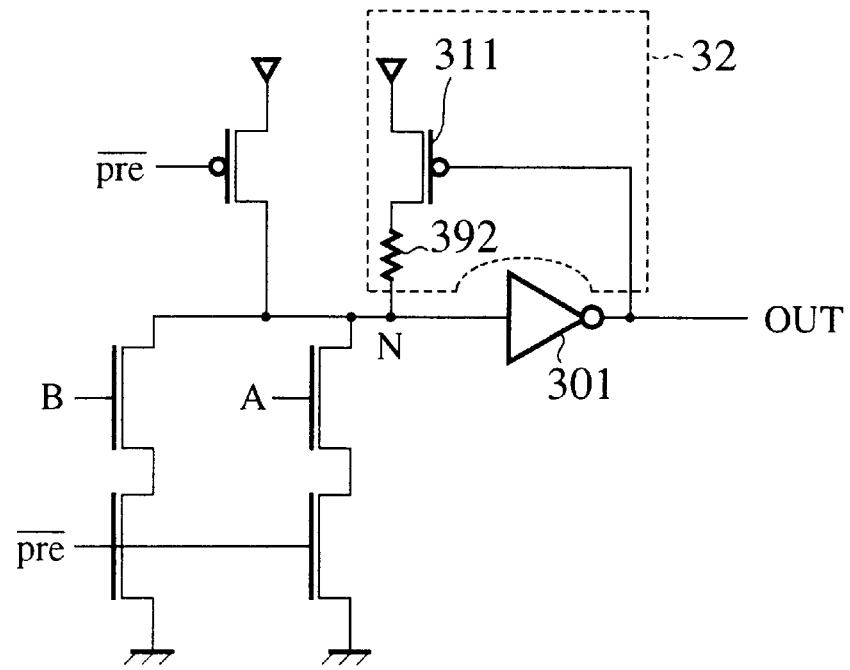
FIG. 19 shows another logic circuit having a precharger according to the second embodiment.

FIG. 19 shows a logic circuit having a precharger according to a modification of the second embodiment of the present invention. This circuit is equivalent to the circuit of FIG. 18 but without the resistor 391. When operating at high speed, the logic circuit of FIG. 19 is not a complete dynamic circuit, and therefore, is inferior to the logic circuit of FIG. 18. The logic circuit of FIG. 19, however, is favorable, because it has small number of elements. When operating at low speed, the logic circuit of FIG. 19 is identical to a static circuit and operates faster than the conventional static circuits. The logic circuit of FIG. 19, therefore, is ready for new applications. In this way, the logic circuit of the second embodiment automatically acts as a dynamic circuit when operating at high speed and as a static circuit when operating at low speed.

(Third Embodiment)

Figure 20:
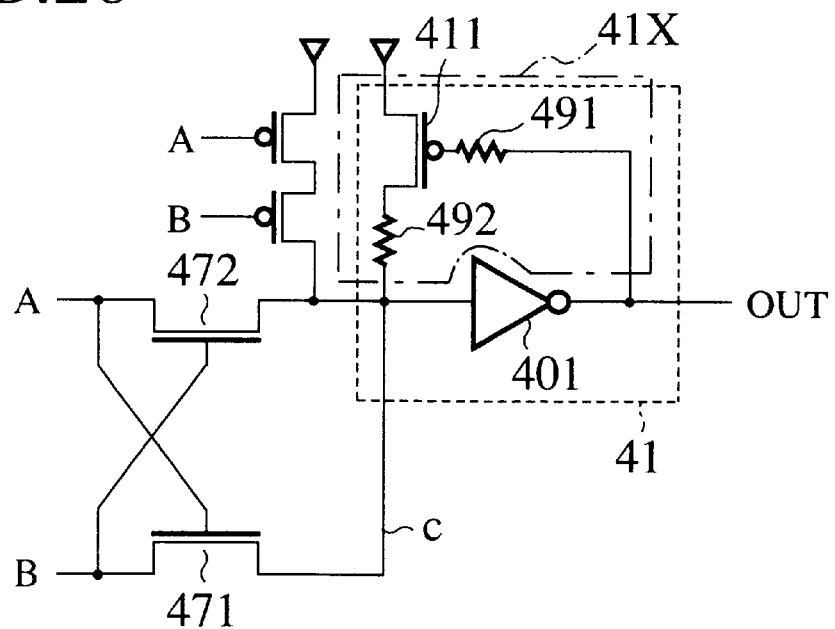
FIG. 20 shows an EOR circuit according to a third embodiment of the present invention.
Figure 20:
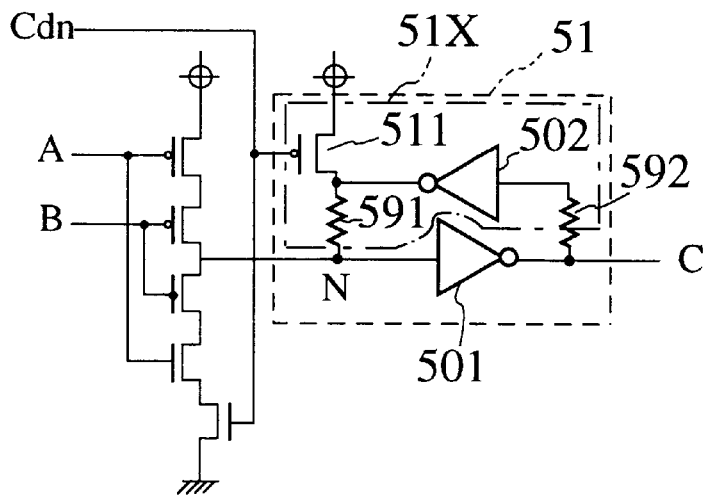

FIG. 20 shows an EOR circuit employing pass transistors, according to the third embodiment of the present invention. An output CMOS inverter 401 serving as an amplifier, an electric resistor 492 connected to the input of the inverter 401, an electric resistor 491 connected to the output of the inverter 401, and a p-channel MOS transistor 411 serving as a switching device form a loop circuit, i.e., an output voltage compensation circuit 41.

The charge retention circuit 41X in the compensation circuit 41 has time constants T1 and T2. T1 is determined by the product of the resistance of the resistor 491 and the input capacitance of the switching means 411. T2 is also defined by the product of the resistance and the capacitance around the output terminal of the circuit 41X. Here, the resistance is a summation of the resistance of the resistor 492 and the ON-resistance of the switching means 411. The capacitance is a total of parasitic capacitances on the node "c" including the input capacitance of the amplifying means 401. The time constants T1 and T2 are set to be sufficiently large so that the charge retention circuit 41X may have no relation with the operation of the EOR circuit when the EOR circuit operates at high speed. At this time, the charge retention circuit 41X is disconnected from the EOR circuit, and therefore, the EOR circuit is identical to the high-speed EOR circuit of FIG. 5. In low-speed operation, the resistors 491 and 492 do not disconnect the charge retention circuit 41X from the EOR circuit. Since a direct current component is ignorable due to the characteristics of the CMOS, the resistors 491 and 492 substantially provide no effect on the EOR circuit during low-speed operation. When inputs A and B are at a source voltage, the voltage of a terminal "c" is dropped from the source voltage by the threshold voltage $V_{th}$ of n-channel MOS transistors 471 and 472. This voltage drop due to the threshold voltage of the MOS transistors is solved by turning on the p-channel MOS transistor 411 in the compensation circuit 41. According to the prior art, the voltage drop due to the transistors 471 and 472 prevents the p-channel transistor of the CMOS inverter 401 from sufficiently turning off, thereby steadily passing a short current. To solve this problem, the EOR circuit of FIG. 20 activates the charge retention circuit 41X during low-frequency operation whose period is sufficiently longer than the time constants T1 and T2. When the voltage of the terminal "c" exceeds a given value, the compensation circuit 41 carries out feedback control to increase the voltage of the terminal "c" to the source voltage, to thereby prevent the steady short current in the inverter 401. Since the time constants T1 and T2 of the charge retention circuit 41X are sufficiently larger than the time corresponding to the high operation speed of the EOR circuit, the charge retention circuit 41X is disconnected from the EOR circuit during high-speed operation. As a result, the inputs A and B may drop to a ground level, and the compensation circuit 41 never interferes with the high-speed operation of the EOR circuit.

The resistors 491 and 492 are integrated on a semiconductor substrate similar to the first embodiment. Namely, the resistors 491 and 492 may be the diffused resistors, polycrystalline silicon resistors, metal thin film resistors, or contact resistors of the first embodiment. Alternatively, the resistors 491 and 492 may be the active resistors of FIGS. 16A to 17A.

Figure 5:
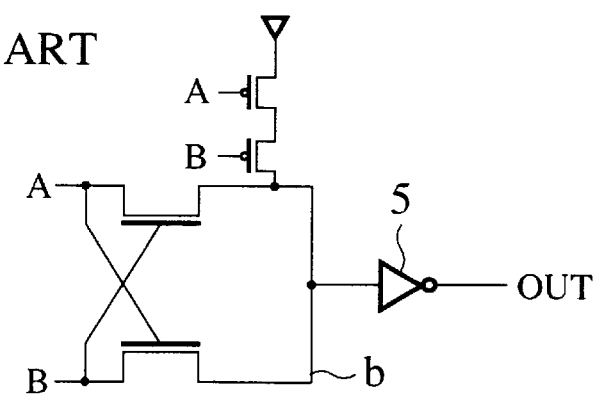
FIG. 5 shows an EOR circuit according to a prior art.
Figure 6:
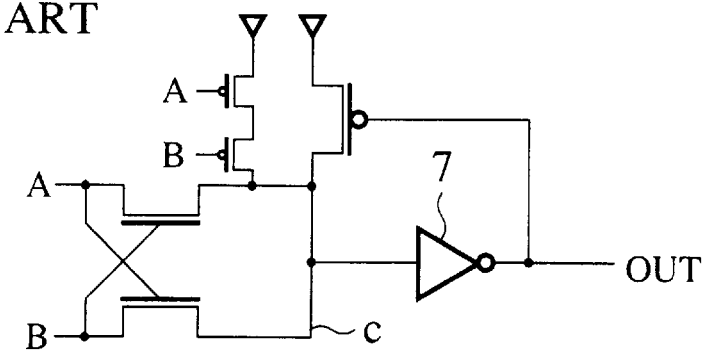
FIG. 6 shows an EOR circuit according to a prior art.

As explained above, the EOR circuit of the third embodiment is equivalent to the EOR circuit of FIG. 5 when operating at high speed and to the EOR circuit of FIG. 6 when operating at low speed, thereby providing a logic circuit operating at high speed with low power dissipation without the short current in the output inverter.

(Fourth Embodiment)

Figure 21:
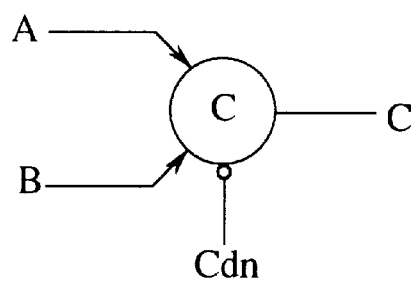
FIG. 21 shows a C element circuit according to a fourth embodiment of the present invention.

FIG. 21 shows a logic circuit employing a C element according to the fourth embodiment of the present invention. This logic circuit is a basic event processing gate for an asynchronous circuit. When inputs A and B are equal to each other, the logic circuit stores the inputs and provides an output C, and when the inputs A and B differ from each other, provides a previously stored value.

Inverters 501 and 502, electric resistors 591 and 592, and a p-channel MOS transistor 511 serving as a switching device form a closed loop circuit 51. The resistors 591 and 592 are inserted in the loop circuit 51 except a main signal line. The partial circuit 51X in the loop circuit 51 has time constants T1 and T2. T1 is determined by the resistance 592 and the input capacitance of the inverter 503. T2 is defined by the resistance and the capacitance around the output terminal of the partial circuit 51X. Here, the resistance is a summation of the resistance of the resistor 591 and the ON-resistance of the inverter 502. The capacitance is a total of parasitic capacitances on the node N including the input capacitance of the inverter 501. Since the p-channel transistor 511 is turned off during the high-speed operation of the C-element, it can be ignored in the discussion of the speed of the c-element. The time constants T1 and T2 are set to be sufficiently large so that the partial circuit 51X may have no influence on the operation of the logic circuit during high-speed (high-frequency) operation. During low-speed (low-frequency) operation, the resistors 591 and 592 do not disconnect the partial circuit 51X from the logic circuit, and the logic circuit operates like a static circuit to feedback-control and hold data even if a clock signal is stopped. Namely, during low-frequency operation whose period is sufficiently longer than the time constants T1 and T2, the resistors 591 and 592 act nothing as if they are not present in the logic circuit. In this way, the logic circuit of the fourth embodiment is equivalent to a dynamic circuit when operating at high speed and to a static circuit when operating at low speed.

The resistors 591 and 592 are integrated on a semiconductor substrate similar to the first embodiment. Namely, the resistors 591 and 592 may be the diffused resistors, polycrystalline silicon resistors, metal thin film resistors, or contact resistors of the first embodiment. Alternatively, the resistors 591 and 592 may be the active resistors of FIGS. 16A to 17A.

(Fifth Embodiment)

Figure 22:
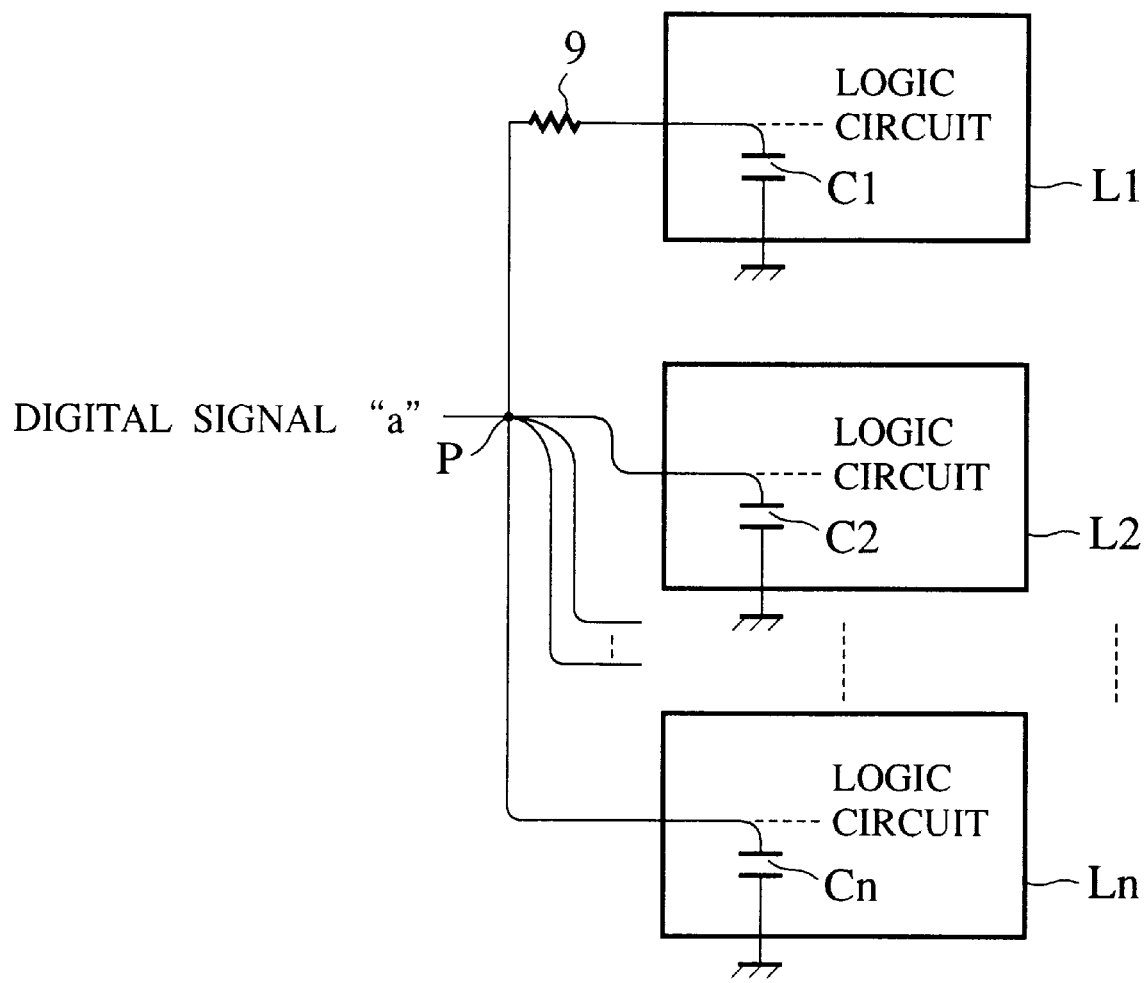
FIG. 22 shows logic circuits according to a fifth embodiment of the present invention.

FIG. 22 shows a system having logic circuits according to the fifth embodiment of the present invention. A digital signal "a" is branched at a node P and simultaneously supplied to the logic circuits L1 to Ln. Among the logic circuits, for example, the logic circuit L1 is allowed to operate at low speed, and the logic circuits L2 to Ln are required to operate at high speed. An electric resistor 9 is formed between an input terminal of the logic circuit L1 and the node P. The low-speed logic circuit L1 has a delay time T determined by the product of the input load capacitance C1 of the logic circuit L1 itself and the resistance R of the resistor 9. A signal to the logic circuit L1 is delayed by the delay time T. This means that, when the digital signal "a" arrives at the node P, the low-speed logic circuit L1 is substantially disconnected from the other high-speed logic circuits due to the resistor 9. Since the load capacitance C1 of the low-speed logic circuit L1 is removed from the other high-speed logic circuits, the digital signal "a" is quickly supplied to the high-speed logic circuits L2 to Ln.

The low-speed logic circuit L1 having the resistor 9 is not required to operate at high speed. The other high-speed logic circuits that are required to operate at high speed have no resistor. As a result, the operation speed of the system as a whole is improved. When a resistor is added to a CMOS circuit, the waveform of a signal in the circuit becomes dull to cause a short current and increase power dissipation. Except this, the energy dissipation of the system is basically unchanged.

The system of the fifth embodiment provides different equivalent circuits depending on operation frequencies. The resistance and capacitance of the low-speed logic circuit L1 to which the resistor 9 is added according to the fifth embodiment form a low-pass filter, and the system provides different equivalent circuits above and below the cutoff frequency of the low-pass filter.

The resistor 9 of the fifth embodiment may be the diffused resistor, polycrystalline silicon resistor, metal thin film resistor, or contact resistor of the first embodiment. Alternatively, the resistor 9 may be the active resistor of FIGS. 16A to 17A. Proper one is selected according to design specifications and is monolithically formed on a semiconductor chip.

The fifth embodiment disconnects a low-speed logic circuit, which is not required to operate at high speed and has large input capacitance to hinder high-speed operation, from a signal line for a given period, thereby reducing load capacitance on the other high-speed logic circuits and realizing high-speed operation.

Figure 23:
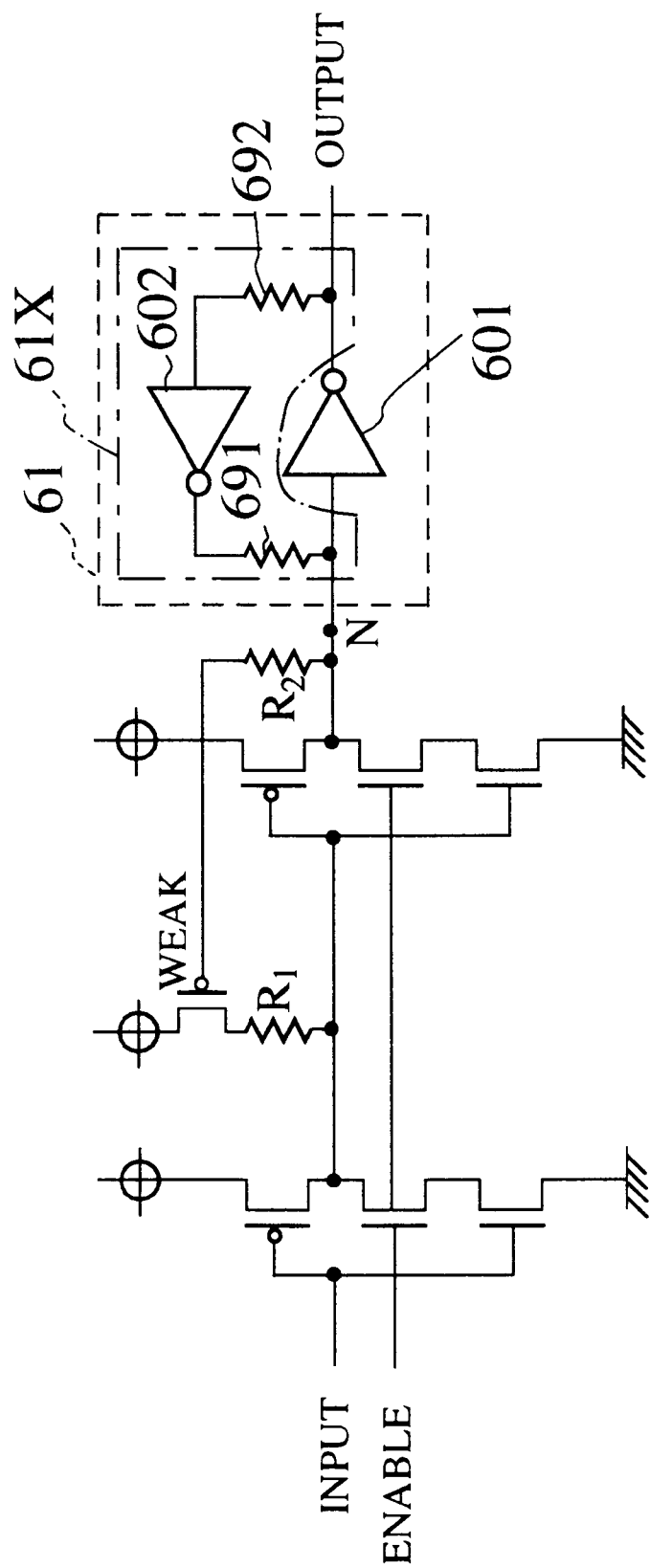
FIG. 23 shows a Svensson latch according to still another embodiment of the present invention.

Various modifications will become possible for those skilled in the art after receiving the teachings of the present disclosure without departing from the scope thereof. For example, the present invention is applicable to a Svensson latch (true single-phase latch) of FIG. 23. An output inverter 601, an electric resistor 691 connected to the input of the inverter 601, an electric resistor 692 connected to the output of the inverter 601, and an inverter 602 arranged between the resistors 691 and 692 form a closed loop circuit 61. The partial circuit 61X has time constants T1 and T2. T1 is determined by the resistance of the resistor 692 and the input capacitance of the inverter 602. T2 is determined by the summation of the resistance of the resistor 691 and the ON-resistance of the inverter 602, and the parasitic capacitance on the node N including the input capacitance of the inverter 601. The time constants T1 and T2 are set to be sufficiently large so that the partial circuit 61X may have no relation with the operation of the logic circuit when the logic circuit operates at high speed. During low-speed operation, the resistors 691 and 692 do not disconnect the partial circuit 61X from the logic circuit, and the logic circuit operates like a static circuit to carry out feedback control to keep data even if a clock signal is stopped. Namely, the resistors 591 and 592 have no influence on the logic circuit as if they are not present during low-speed operation whose period is sufficiently longer than the time constants T1 and T2. In this way, the Svensson latch according to the present invention operates dynamically at high speed and statically at low speed.

What is claimed is:

1. A logic circuit having a signal line for transmitting a digital signal and a circuit for memory means having input and output terminals connected to the signal line, an even number of signal inverting means and a part of the signal line included in a loop circuit between the input and output terminals, with the rest of the loop circuit comprising the memory means, the logic circuit comprising:

a first electric resistance means directly connected to the input terminal without inserting any active components between the input terminal and the signal line; and a second electric resistance means directly connected to the output terminal without inserting any active components between the output terminal and the signal line.

2. The circuit of claim 1, wherein the signal inverting means are each an inverter circuit.

3. A logic circuit having a signal line for transmitting a digital signal and a circuit for memory means that includes input and output terminals connected to the signal line, a signal amplifying means and a part of the signal line included in a loop circuit between the input and output terminals, with the rest of the loop circuit comprising the memory means, the logic circuit comprising:

a first electric resistance means directly connected to the input terminal without inserting any active components between the input terminal and the signal line; and a second electric resistance means directly connected to the output terminal without inserting any active components between the output terminal aid the signal line;

wherein a signal is transmitted in the loop circuit without changing its polarity.

4. A logic circuit comprising:

(a) a signal line for transmitting a digital signal;

(b) first memory means which includes a plurality of first signal inverting means arranged on the signal line; and (c) second memory means electrically coupled with the signal line, comprising:

at least two second signal inverting means;

a first electric resistance means directly connected to the input terminal of the second memory means without inserting any active components between the input terminal and the signal line; and a second electric resistance means directly connected to the output terminal of the second memory means without inserting any active components between the output terminal and the signal line, wherein a part of the signal line is included in a loop circuit between the input and output terminals, with the rest of the loop circuit comprising the second memory means.

5. A logic circuit having a signal line for transmitting a digital signal and memory means having input and output terminals connected to the signal line and an even number of signal inverting means, the logic circuit comprising:

a first electric resistance means connected to the input terminal of the memory means; and a second electric resistance means connected to the output terminal of the memory means, wherein said digital signal is transferred at two nodes including a high frequency digital signal and a low frequency digital signal, said memory means having a first time constant T1 determined by a product of a resistance of said first electric resistance means and an input capacitance of said memory means and a second time constant T2 determined by a product of a resistance including the second electric resistance means and a capacitance around the output terminal of said memory means, wherein the first time constant T1 and the second time constant T2 are larger than a transition time of the high frequency digital signal.

6. A logic circuit having a signal line for transmitting a digital signal and a memory means having a signal amplifying means whose input and output terminals are connected to the signal line, the logic circuit comprising:

a first electric resistance means electrically connected to the input terminal of the signal amplifying means; and a second electric resistance means electrically connected to the output of the signal amplifying means, wherein said digital signal is transferred at two modes including a high frequency digital signal and a low frequency digital signal, said memory means has a first time constant T1 determined by a produce of a resistance of said first electric resistance means and an input capacitance of said signal amplifying means and a second time constant T2 determined by a product of a resistance including said second electric resistance means and a capacitance around the output terminal of said memory means, wherein the first time constant T1 and the second time constant T2 are larger than a transition time of the high frequency digital signal.

7. A logic circuit comprising:

(a) a signal line for transmitting a digital signal;

(b) first memory means which includes a plurality of first signal inverting means arranged on the signal line; and (c) second memory means electrically coupled with the signal lien and having a loop circuit comprising at least two second signal inverting means and a first electric resistance means connected to the input terminal of the second memory means and a second electric resistance means connected to the output terminal of the second memory means, wherein said digital signal is transferred at two modes including a high frequency digital signal and a low frequency digital signal, said loop circuit has a first time constant T1 determined by a product of a resistance of said first electric resistance means and an input capacitance of said second memory means and a second time constant T2 determined by a product of a resistance including said second electric resistance means and a capacitance around the output terminal of said second memory means, wherein the first time constant T1 and the second time constant T2 are larger than a transition time of the high frequency digital signal.

8. A logic circuit comprising:

(a) a signal line for transmitting a digital signal;

(b) first memory means having a plurality of first signal inverting means arranged on the signal line; and (c) second memory means electrically coupled with the signal line comprising:

at least one signal amplifying means;

a first electric resistance means directly connected to the input terminal of the second memory means without inserting any active components between the input terminal and the signal line; and a second electric resistance means directly connected to the output terminal of said second memory means without inserting any active components between the output terminal and the signal line, wherein a part of the signal line is included in a loop circuit between the input and output terminals, with the rest of the loop circuit comprising the second memory means.

* * * * *